United States Patent [19]

Ikeda et al.

[11] Patent Number: 5,413,835
[45] Date of Patent: May 9, 1995

[54] MAGNETIC RECORDING MEDIUM HAVING AN UNDERLAYER OF LOW MELTING POINT METAL ALLOY IN THE FORM OF SPHERICALLY SHAPED STRUCTURES

[75] Inventors: Yoshihiro Ikeda, Yokohama; Shinji Takayama, Tokyo, both of Japan

[73] Assignee: International Business Machines Corporation, Armonk, N.Y.

[21] Appl. No.: 23,413

[22] Filed: Feb. 26, 1993

[30] Foreign Application Priority Data

Mar. 16, 1992 [JP] Japan .................................. 4-055967

[51] Int. Cl.$^6$ .......................... G11B 5/00; C23C 14/00
[52] U.S. Cl. ..................................... 428/141; 428/142; 428/148; 428/457; 428/611; 428/642; 428/645; 428/646; 428/648; 428/658; 428/659; 428/694 TS; 428/694 TR; 428/900; 428/928
[58] Field of Search ............... 428/611, 642, 645, 646, 428/648, 658, 659, 694 TS, 156, 900, 141, 457, 148, 142, 694 TR

[56] References Cited

U.S. PATENT DOCUMENTS

| | | | |
|---|---|---|---|
| 4,254,189 | 3/1984 | Fisher | 428/626 |
| 4,539,265 | 9/1985 | Yazawa et al. | 428/621 |
| 4,543,301 | 9/1985 | Yazawa et al. | 428/621 |
| 5,134,038 | 7/1992 | Baseman et al. | 428/611 |

OTHER PUBLICATIONS

Khandros et al. Thin-Film Topography Control with Transient Liquid Underlayer, J. Vac Sci. Technol A7(3) May/Jun. 1989, pp. 1334-1340.
C. Vahlas et al. Adsorption-Induced Solid-Liquid Interfacial Roughening in Zn Alloys J. Crystal Growth Sep. 92 (1988) 253-258.

*Primary Examiner*—Stevan A. Resan
*Attorney, Agent, or Firm*—Philip J. Feig; Stephen S. Strunck

[57] ABSTRACT

A magnetic recording medium includes a successively formed uneven underlayer and magnetic layer. In the process of forming the underlayer, grains of an alloy, whose melting point is in the range of approximately 100 degrees centigrade to approximately 350 degrees centigrade, are deposited on a substrate by using either an evaporation or a sputtering method, while maintaining the substrate temperature at a temperature which allows molten spheres of the alloy to be formed. The preferred alloys include Zn, Mg, Al, In, and Sn systems whose melting points fall within the above-mentioned temperature range. The preferred substrate temperatures are not higher than the melting point of the alloy to be deposited plus 50 degrees centigrade, and most preferably, temperatures equal to approximately the melting point of the alloy to be deposited minus 20 degrees centigrade. The result is a magnetic recording medium suitable for practical use which can be fabricated at a low cost. In addition, in magnetic recording apparatus, the occurrence of adhesion between a magnetic recording medium and a transducer head is reduced.

2 Claims, 4 Drawing Sheets

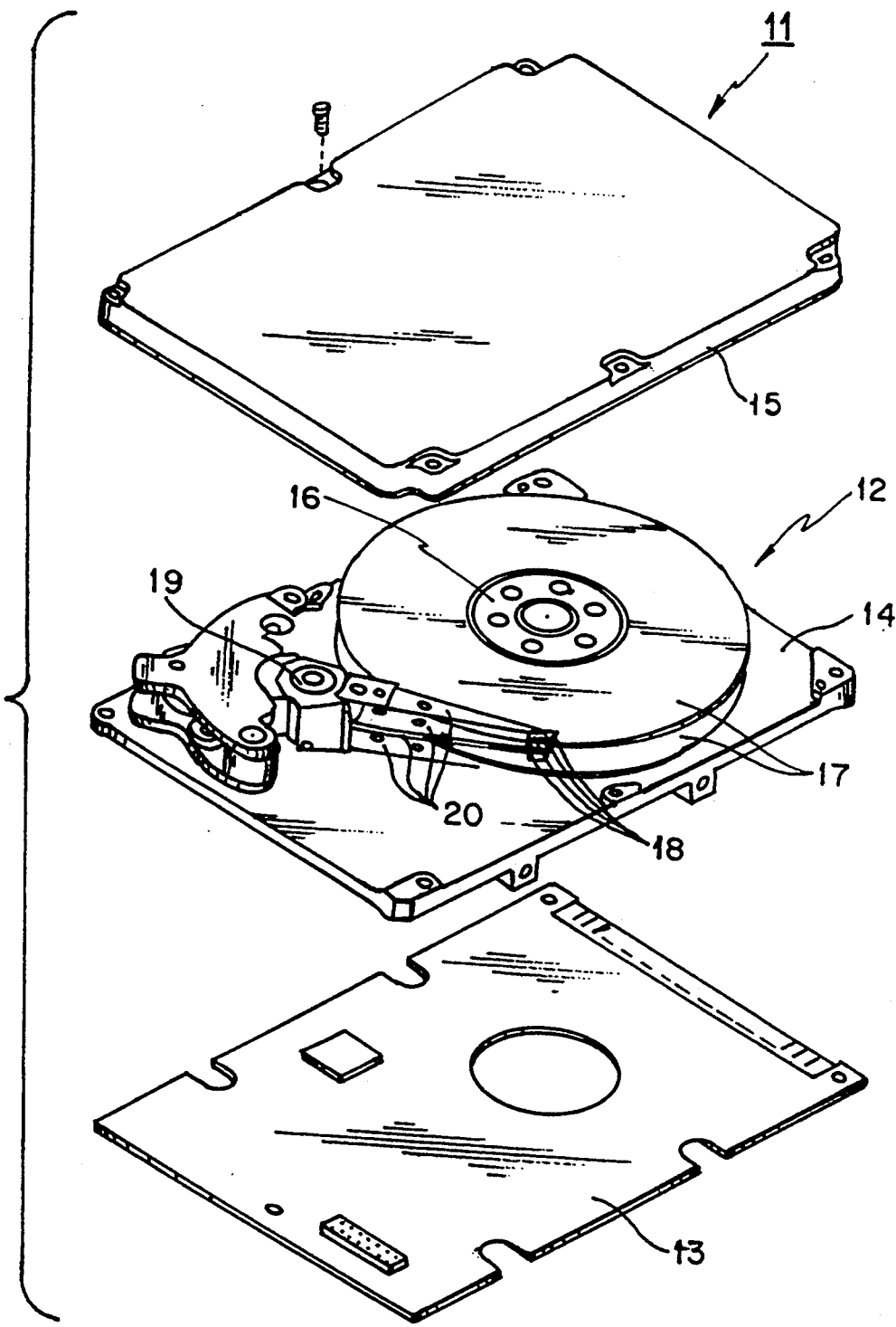

MAGNETIC RECORDING MEDIUM HAVING AN UNDERLAYER OF LOW MELTING POINT METAL ALLOY IN THE FORM OF SPHERICALLY SHAPED STRUCTURES

BACKGROUND OF THE INVENTION

This invention is related to a magnetic recording medium, a method for manufacturing the same, and a magnetic recording apparatus.

In recent years, with higher computer utilization, the quantity of data handled in computer systems has risen rapidly, and there has been a corresponding increase in the need for high-speed data exchange. A magnetic rigid disk recording system has recently been put to practical use as an external storage device to meet this need.

In the magnetic rigid disk recording system, transducer heads fly above the recording surface of a rotating disk-shaped magnetic recording medium, reading or writing data to the medium. By reducing the flying height, higher-density data can be recorded. To keep this very low height stable, a contact start/stop (CSS) method is used, in which the head is in contact with the disk surface when it is at rest. Employment of this method has greatly contributed to an increase in the recording density, but at the same time has caused various new problems. One of these problems is strong adhesion between the head and the disk when they are at rest.

In order to solve this problem, a method called texturing has been employed for mechanically making the disk substrate surface uneven by using abrasive particles. The roughness of the substrate surface is reflected in the surface roughness of a disk completed by depositing magnetic layers and so on, and accordingly tile static friction coefficient between head and disk decreases, and this in turn reduces the adhesion force. However, this method easily causes irregularities in the disk surface roughness. As a consequence, problems arise when high asperity causes a head crash or when impure materials react chemically with magnetic layers in deep valleys. In addition, a process for texturing must be undertaken before disposing thin films on the substrate. Furthermore, the process requires large-scale apparatus, which increases the cost.

As a technique for solving this, it is proposed in the Japanese Published Unexamined Patent Application No. 46223/1989 (1-46223) official gazette that an uneven underlayer be formed by depositing grains of an inorganic compound such as $SiO_2$ or a pure metal element such as Cu on the disk substrate by means of a sputtering method or evaporation method, and that a magnetic layer be provided thereon. However, this technique involves the problems of peeling of the underlayer from the substrate, degradation of magnetic properties, and insufficient surface roughness for texturing, and thus it is not suitable for practical use.

Further, as disclosed in the Japanese Published Unexamined Patent Application No. 240429/1986 (61-240429) official gazette, an attempt was made to improve the magnetic properties of the magnetic layer by applying an underlayer of a metal with a low melting point. The metals of this type disclosed therein are In, Sn, Bi, Ga, and Gain. However, this attempt did not positively utilize deposition of such a metal onto a substrate as an alternative to mechanical texturing. There was also a problem of marked degradation of the magnetic properties of the magnetic layer. The coercive force of the medium disclosed in this official gazette has a very low value of 600 Oe.

In the Japanese Published Unexamined Patent Application No. 189922/1991 (3-189922) official gazette, deposition of a low-melting-point metal underlayer is used as an alternative to mechanical texturing. The method disclosed therein comprises the steps of depositing a transient liquid metal on a substrate, and maintaining the liquid metal layer in a liquid state while depositing a magnetic layer on the transient liquid metal layer, whereby the transient liquid metal reacts with the magnetic layer. The material of the underlayer that is the main subject of discussion is a pure metal (Ga). However, although the maximum coercive force of the medium shown as an embodiment is about 1800 Oe, its coercive squareness remains about 0.6. Accordingly, it can be said that there is room for improvement in its magnetic properties. Further improvement is also desired in the roughness of the medium surface. It is explained later that, if the above method is used, the underlayer must be made thick to obtain a surface roughness of substantially the same degree as in the present invention.

SUMMARY OF THE INVENTION

The inventors paid attention to the transient liquid phase of materials as a means for controlling the roughness of the medium surface. This method is also used in the Japanese Published Unexamined Patent Application No. 189922/1991 (3-189922) official gazette. When vapor or plasma from a material contacts a substrate whose temperature is near or higher than the melting point of the material in a vacuum, the material changes into small liquid spheres, which are deposited on the surface. The size of the spheres increases in proportion to the amount of the material that has been deposited. Consequently, by controlling the sphere size, an underlayer consisting of grains of an optimum size can be deposited on the substrate. By forming thereon a magnetic layer and an overcoat layer, a medium having controlled surface roughness is obtained.

The most important consideration is selection of a material to be used for the underlayer. Practically, if the melting point of the material is as high as possible, it is more stable, because it does not melt when used. On the other hand, a material whose melting point is as low as possible involves less cost, because it does not require a special vacuum chamber for high-temperature processes. In view of these considerations, it was found that materials having a melting point in the order of 100 to 350 degrees centigrade are optimum. Pure metals that have such melting points include In, Li, Sn, and Bi. However, if a Cr layer as a crystal orientation control layer, or a magnetic layer is deposited oil an underlayer composed of a pure metal, good magnetic properties cannot be obtained. The reason for this is considered to be that the underlayer metal easily reacts with the Cr or magnetic layer deposited thereon. In this invention, it was found that the use of a metal whose melting point lies within the above-mentioned temperature range could markedly suppress the reaction with the subsequently deposited layer, and that good magnetic properties suitable for practical use could be obtained without degrading the magnetic properties of the magnetic layer. In addition, because the surface tension of an alloy changes more than that of a pure metal, it was possible to obtain a steep roughness which could not be accomplished before. In an actual CSS test, there was a low rate of occurrence of head crash, and the media interface properties were excellent. In accordance with this invention, sufficient medium surface roughness can be obtained with a low average thickness for the underlayer, whereas in the prior art, more metal had to be deposited in order to increase the average thickness of the underlayer and thus to obtain sufficient medium surface roughness. Moreover, since an alloy system allows the melting point and surface tension to be changed by altering the composition, optimum conditions corresponding to the substrate material and manufacturing environment can be found.

For the alloy used for the underlayer, the Zn-based, Mg-based, Al-based, In-based, and Sn-based alloys are preferred in view of practical considerations such as the melting point and surface tension requirements mentioned above. The compositions satisfying these requirements are expressed by the general formulas $Zn_{100-x}M_x$ (where M is at least one element selected from a group consisting of In, Sn, Bi, and Li), $Mg_{100-y}L_y$ (where L is at least one element selected from a group consisting of Pb, In, and Sn), $Al_aGa_{100-a}$, $Al_bSn_{100-b}$, $Bi_{100-c}N_c$ (where N is at least one element selected from a group consisting of Pb, In, and Sn), and $T_{100-d}A_d$ (where T is at least one element selected from a group consisting of In and Sn, A is at least one element selected from a group consisting of Pb and Sn, and T and A are different elements), where x, y, a, b, c, and d satisfy $70 \leq x \leq 99$, $70 \leq y = 99$, $10 \leq a \leq 35$, $1 \leq b \leq 5$, $1 \leq c \leq 99$, and $10 \leq d \leq 60$ in atomic percentage points, respectively.

The preferred ranges are $80 \leq x \leq 98$, $80 \leq y \leq 94$, $30 \leq c \leq 85$ and $20 \leq d \leq 55$ for obtaining alloys that are resistant to reaction with later deposited layers. The reason for this is that, in these ranges, there is a high possibility that the alloy itself win form an alloy compound without reacting with the magnetic layer deposited on it. A more highly preferred composition is in the range of ±10 atomic percent from the eutectic point. (For instance, for InZn, the proportion of In in the eutectic alloy composition is 95 atomic percent. Accordingly, the most preferred composition of InZn is obtained when the atomic percentage of In is in the range of 85 to 95.) The reason for this is that, in this range, an alloy's constituent atoms easily bond together, thereby causing a markedly low level of reaction between the alloy layer and other layers subsequently deposited thereon.

An underlayer of irregular thickness is formed by depositing molten spheres of one of the above alloys on a substrate, using tire evaporation or sputtering method. Since the alloys used in this invention have low melting points, molten spheres appear on the substrate surface if the substrate temperature is maintained at or above room temperature. However, the preferred temperatures have an upper limit. In order to improve the magnetic properties of the magnetic recording medium, the substrate needs to be maintained at a temperature not higher than the melting point of the deposited alloy plus 50 degrees centigrade in the process of forming the underlayer. Further, in order to obtain the most preferred magnetic properties, the substrate temperature should be heated to the vicinity of the alloy's melting point minus 20 degrees centigrade.

By forming the alloy underlayer in this way, it is possible to fully roughen the substrate surface without using a large-scale texturing apparatus. Accordingly, the cost of manufacturing magnetic recording media can be substantially reduced from that of the conventional method, Finally, the magnetic recording apparatus of this invention comprises: at least one magnetic disk, means for rotating said disk, a transducer head for reading or writing data, flying above the recording surface of said rotating magnetic disk, means for positioning said transducer heads over desired tracks on the recording surface of said magnetic disk, and a housing for enclosing said magnetic disk, means for rotating the magnetic disk, transducer heads, and means for positioning the transducer heads, said magnetic disk including all uneven underlayer consisting of grains of an alloy and a magnetic layer that are formed successively on a substrate, the melting point of said alloy being in the range of approximately 100 degrees centigrade to approximately 350 degrees centigrade.

A principal object of the present invention is therefore the provision of a low cost magnetic recording medium suitable for practical use.

A further object of the invention is to suppress the occurrence of adhesion between the magnetic recording medium and the transducer head in a magnetic recording apparatus.

Another object of the invention is to improve the magnetic properties of a magnetic recording medium having an uneven underlayer comprising metal grains deposited on a substrate.

Yet another object of the invention is to heighten the unevenness of the underlayer comprising metal grains deposited on a substrate without thickening the underlayer.

Further and still other objects of the invention will become more clearly apparent when the following description is read in conjunction with the accompanying drawings.

BRIEF DESCRIPTION OF THE DRAWING

FIG. 8 is a developed perspective -view of the magnetic recording apparatus of the present invention.

DETAILED DESCRIPTION

Figure 1:
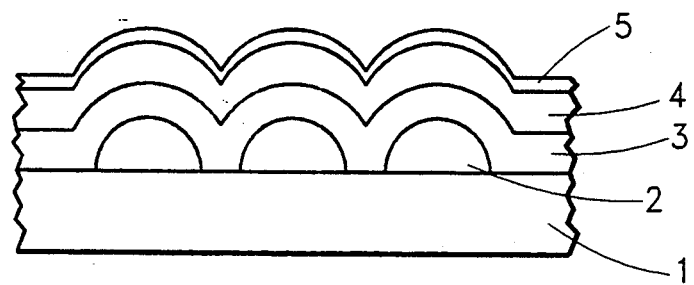
FIG. 1 is a sectional view of a magnetic recording medium of the present invention.

FIG. 1 is a sectional view of a magnetic disk in accordance with the teachings of the present invention, in which reference numeral 1 is a glass or Al—Mg/Ni—P substrate, reference numeral 2 is an alloy underlayer, reference numeral 3 is a magnetic layer, and reference numeral 4 is an overcoat of carbon or hard ceramic. In addition, a metallic thin film of a material such as Cr may be inserted between layers 2 and 3 to improve the properties of the magnetic layer. The alloy grains of underlayer 2 may be continuous, though they are often distributed discontinuously as shown in FIG. 1. The preferred manufacturing method for practicing the present invention is specifically described with reference to specific embodiments, but the invention is not so limited.

The compositions of the alloys appearing in the following description are expressed in atomic percent. In addition, numerical values indicating the thicknesses of uneven alloy underlayers are described below. Each of these values represent the thickness of a layer which would be formed if an alloy for the layer was deposited with a uniform thickness, and correspond to the average thickness of the uneven alloy underlayer.

In a preferred method of making an alloy layer by the evaporation method a substrate, such as a glass substrate, is disposed in a high-vacuum evaporation chamber apparatus, and as an evaporation source, several hundred milligrams of an In—Zn alloy previously manufactured with eutectic point composition (composition ratio: 95:5, melting point: 143.5 degrees centigrade) are placed on a Ta boat. After the chamber has been pumped down to a high vacuum ($5 \times 10^{-7}$ Torr or less), the substrate is heated to 180 degrees centigrade. When the temperature stabilizes, the boat is energized to deposit an alloy with a thickness of 500 angstroms on the substrate surface. An alloy layer made in this way was placed in an RF sputtering apparatus, and a magnetic layer and an overcoat were formed on the alloy layer by the conventional method while maintaining the substrate at room temperature.

In an alternative preferred method of making an alloy layer using a sputtering apparatus, a substrate, such as a glass substrate, is disposed in an RF sputtering apparatus, and after the chamber has been pumped down to a high vacuum of $6 \times 10^{-7}$ Torr of less, the substrate is heated to 100 degrees centigrade. A pure argon gas of 99.99999% purity is introduced into the apparatus, and the gas pressure is set to 0.5 Torr. A radio frequency voltage (50 W) is applied between an InSn alloy target previously made with eutectic point composition (In: 52%, Sn: 48%, melting point: 117 degrees centigrade) and the substrate in order to generate a high-frequency plasma, thereby forming on the substrate a film of the InSn alloy which has a thickness of about 150 angstroms. After this layer has been formed, the substrate is moved onto a magnetic material target in the sputtering apparatus and a magnetic layer and an overcoat are formed in situ while maintaining the substrate temperature at 100 degrees centigrade. Since this method allows the underlayer magnetic layer and overcoat to be created in situ without breaking the vacuum, oxidation due to vacuum breakage can be prevented. For this reason, the magnetic properties of the magnetic recording medium obtained are better than when an evaporation apparatus is used. For instance, for the InSn alloy, the coercive force increases from 1400 Oe to 1800 Oe.

Figure 2:
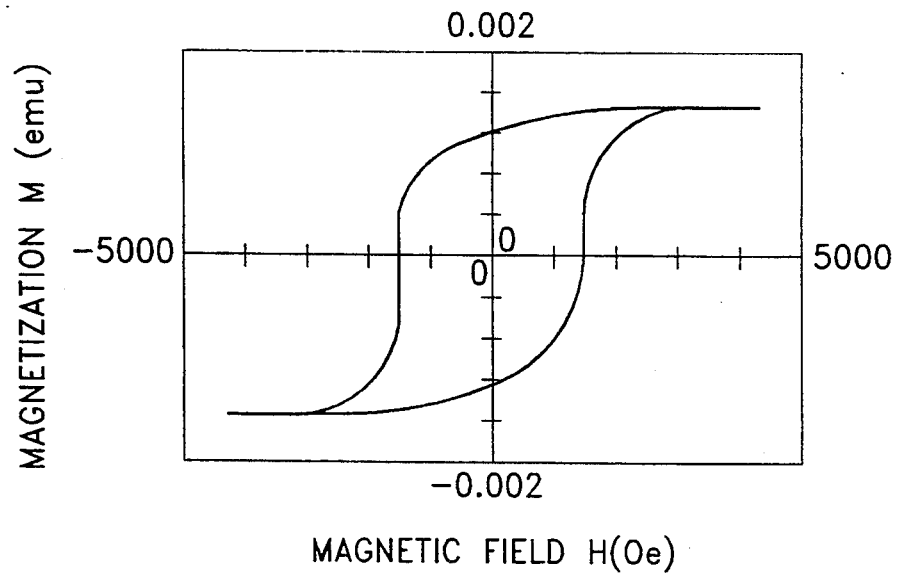
FIG. 2 is a graph showing the hysteresis curve of a magnetic recording medium having $In_{95}Zn_5$ as an underlayer.
Figure 3:
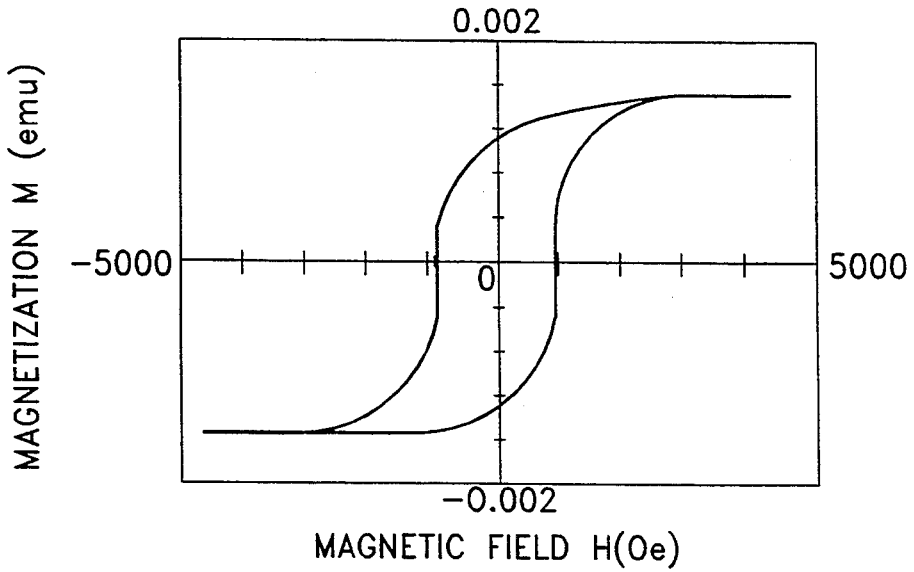
FIG. 3 is a graph showing the hysteresis curve of a magnetic recording medium without an underlayer.

The magnetic properties of the medium according to the present invention are now described with reference to FIGS. 2 and 3. FIG. 2 shows the hysteresis curve of a medium fabricated in accordance with the teachings of the present invention. The medium was made by successively depositing layers of glass/$In_{95}Zn_5$ (film thickness t=500 angstroms)/Cr (t=1000 angstroms)/$Co_{62}Ni_{30}Cr_8$ (t=500 angstroms)/C (t=200 angstroms) on a glass substrate. The RF sputtering method was used to form all the layers on the glass substrate, and the substrate temperature was kept at 150 degrees centigrade. FIG. 3 shows the hysteresis curve of a magnetic recording medium without an underlayer. The latter medium was formed, under the same conditions as shown in FIG. 2, by successively depositing layers of glass/Cr (film thickness t=1000 angstroms)/$Co_{62}Ni_{30}Cr_8$ (t-500 angstroms)/C (t=200 angstroms) on a glass substrate. As is obvious from comparison of the figures, the coercive force Hc was increased from 900 Oe to 1500 Oe by depositing a granular In—Zn film, and better squareness was achieved. These magnetic properties are suitable for high-density recording.

When a medium was prepared, for comparison, under the same conditions as shown in FIG. 3 except that a metal film of pure In was used instead of the InZn film, the maximum value of the obtained coercive force was 1000 Oe. The reason for the difference is that the In in the underlayer reacts with the Cr layer to degrade the magnetic properties of the entire medium.

Figure 4:
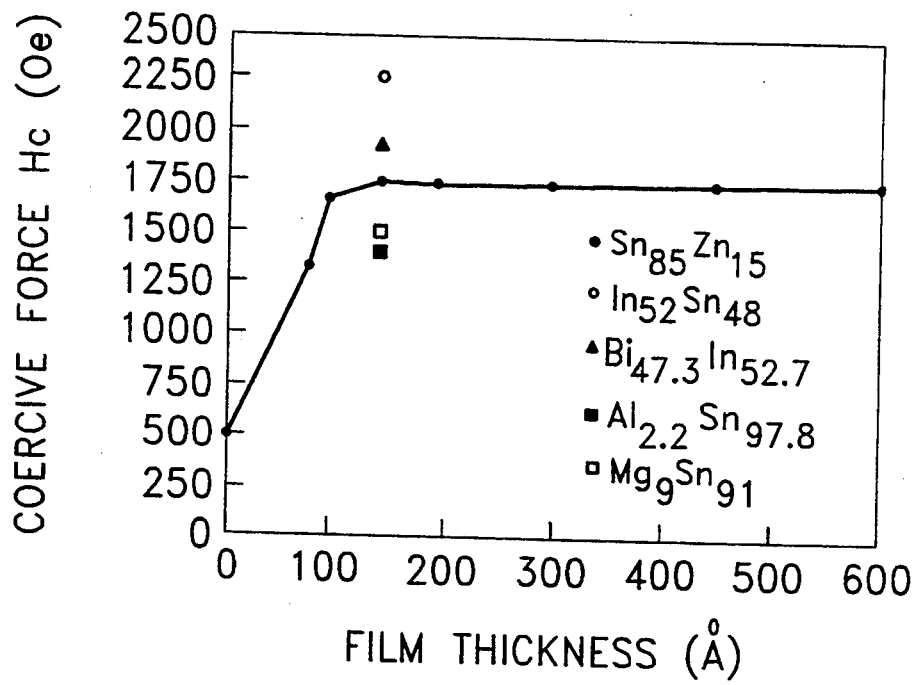
FIG. 4 is a graph showing the relationship between the film thickness of the underlayer and the coercive force of the magnetic recording medium of the present invention.

FIG. 4 shows the dependence on the underlayer film thickness of the coercivity of laminated films of glass/$Sn_{85}Zn_{15}$ (t=0 to 600 angstroms)/$Co_{77}Pt_{11}Cr_{12}$ (t=500 angstroms/C (t=200 angstroms). In this instance, the RF sputtering method was used to form all the layers, and the substrate temperature was maintained at 200 degrees centigrade. It is seen from FIG. 4 that the coercive force increases with the thickness of the underlayer, and substantially saturates at about 150 angstroms. FIG. 4 also shows the coercive forces of the media whose alloy layers are composed of $In_{52}Sn_{48}$ (melting point: 117 degrees centigrade), $Bi_{47.3}In_{52.7}$ (melting point: 109.5 degrees centigrade), $Al_{2.2}Sn_{97.8}$ (melting point: 228.3 degrees centigrade), and $Mg_9Sn_{91}$ (melting point: 200 degrees centigrade) respectively. For all these media, an alloy layer having a film thickness of 150 angstroms was formed on the glass substrate, and $Co_{77}Pt_{11}Cr_{12}$ (t=500 angstroms) was laminated on the alloy layer. For each medium, the RF sputtering method was used to form all layers, and the substrate temperature was maintained at a temperature equal to the melting point of the alloy to be deposited.

Figure 5:
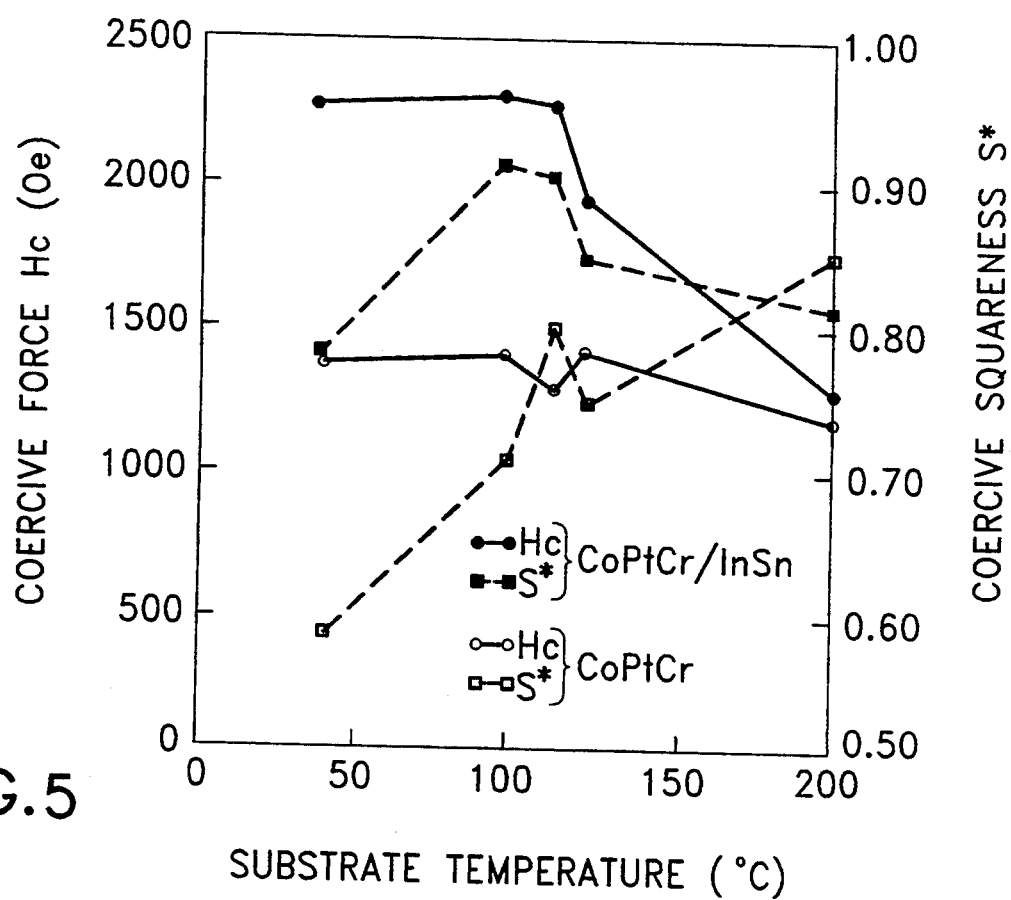
FIG. 5 is a graph showing the substrate temperature dependency of the coercive force and coercive squareness for media with an underlayer of $In_{52}Sn_{48}$ and without an underlayer.

FIG. 5 shows the dependence on the substrate temperature on the coercive force and the coercive squareness for both a medium having a $Co_{77}Pt_{11}Cr_{12}$ layer (t=500 angstroms) and a carbon layer (t=200 angstroms) formed on a glass substrate with $In_{52}Sn_{48}$ (t=150 angstroms) as an underlayer, and a medium raving a $Co_{77}Pt_{11}Cr_{12}$ layer: (t=500 angstroms) and a carbon layer (t=200 angstroms) formed on a glass substrate without an underlayer. RF sputtering method was used to make both media. In addition, the substrate temperature was kept constant all the way through the film formation process for each medium. It can be seen from FIG. 5 that, when there is an underlayer, the magnetic properties degrade if the substrate is heated to a temperature higher than the melting point of $In_{52}Sn_{48}$ (melting point: 117 degrees centigrade) plus 50 degrees centigrade. It can also be seen that a temperature somewhat lower than the melting point of $In_{52}Sn_{48}$ (in FIG. 5, 100 degrees centigrade) is the substrate temperature that most improves the magnetic properties. When the highest coercive force, about 2300 Oe, is obtained, the coercive squareness also shows a very high value of about 0.9. Both values greatly exceed the values of the embodiment disclosed in Published Unexamined Patent Application No. 189922/1991 (3-189922). The tendencies shown in FIGS. 4 and 5 are similar to those of the other alloys considered in this invention, and the properties of the magnetic layer are most improved under conditions in which the film thickness of the underlayer is about 150 angstroms or greater and the substrate temperature is a little lower than the melting point of the alloy to be deposited.

Figure 6:
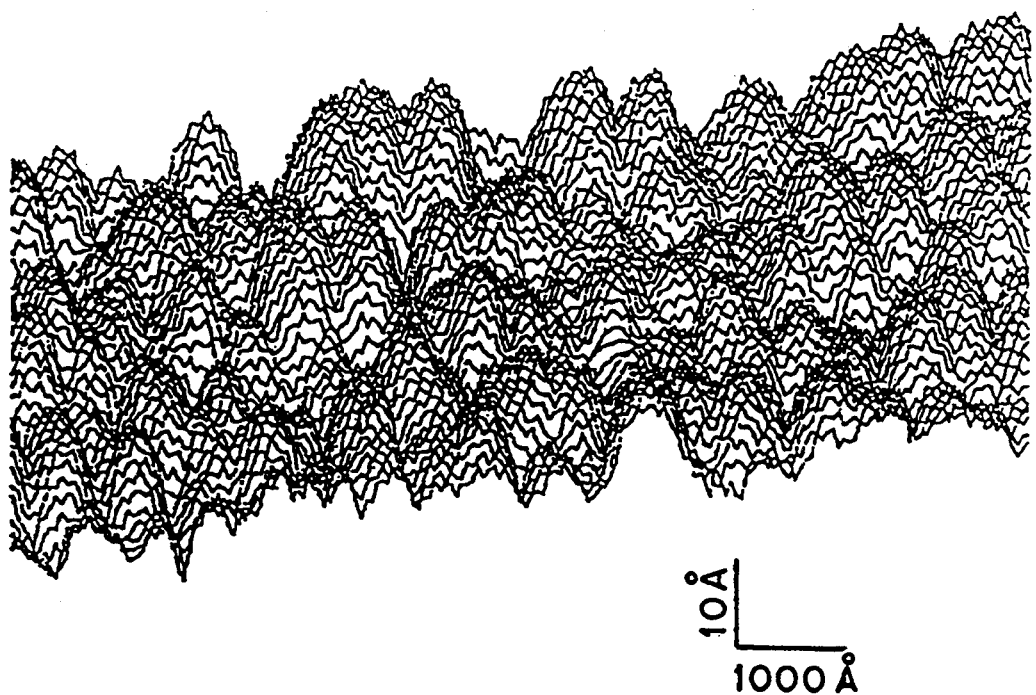
FIG. 6 is a picture showing the unevenness of an InZn film deposited on a glass substrate, measured by STM.
Figure 7:
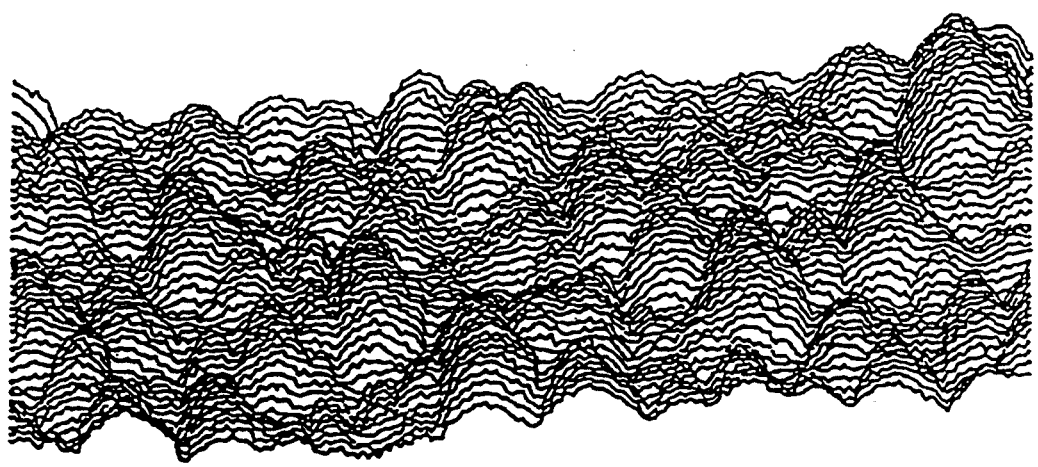
FIG. 7 is a picture showing the unevenness of an In film deposited on a glass substrate, measured by STM.

FIG. 6 shows the results of observation of the surface with a scanning tunneling microscope (STM) at room temperature after a glass substrate had been heated to 180 degrees centigrade and an $In_{95}Zn_5$ alloy film (t=150 angstroms) has been formed. FIG. 7 shows the results of observation of the surface of an In film (t=150 angstroms) at room temperature under the same conditions. The scales of FIGS. 6 and 7 are equal. It can be seen that the InZn film has steep unevenness in comparison with the In film. This is also clearly observed in other alloy systems. For instance, if $In_{52}Sn_{48}$ is used, the diameter of the molten spheres is about 400 angstroms, so that the height of the molten spheres becomes about 150 angstroms, to create the layer of irregular thickness which is most suitable for texturing. The diameter needs to be about 800 angstroms to achieve the suitable roughness if pure In is used.

If mechanical texturing is used, the scale of one asperity on the substrate surface is in the order of microns (1 micron=10,000 angstroms) for both normal and plane directions. Accordingly, it is noted that a substrate surface that has been subjected to mechanical texturing cannot be shown with the scales used in FIGS. 6 and 7.

Next, a disk was made by using an ordinary hard disk. That is, a Ni—P plated film was prepared on the surface of an Al—Mg alloy substrate and polished without texturing. Layers of $In_{52}Sn_{48}$ (t=150 angstroms )/Cr (t=1000 angstroms )/$Co_{77}Ni_{11}Pt_{12}$ (t=500 angstroms)/C (t=200 angstroms) were successively laminated by means of the RF sputtering method while keeping the substrate at 100 degrees centigrade. After coating the disk surface to a height of 20 angstroms with a lubricant, a standard MIG head was placed in contact with the disk surface, and at 60 degrees centigrade and 60% RH moisture, the coefficient of dynamic friction was measured at a drag speed of 100 rpm. The coefficient of dynamic friction of the disk of the embodiment was as low as 0.2 to 0.3, and it was equal to or less than the value (0.3 to 0.4) obtained by using a similar measurement on a commercially available disk in which texturing was applied to the conventional Ni—P film. Thus, with a magnetic disk in accordance with the invention, the coefficient of dynamic friction can be decreased without applying conventional texturing.

In addition, a disk using In for an underlayer was made under the same conditions as the disk described above, in which $In_{52}Sn_{48}$ was used as its underlayer, and a contact start/stop (css) test, which involves intermittently starting and stopping the disk, was performed. As a result, for the disk using In, strong head adhesion occurred after about 1000 cycles, and it was impossible to restart the disk, whereas, for InSn, no adhesion occurred even after 100,000 cycles.

Although embodiments of a magnetic recording medium and a method of manufacturing the same have been shown for binary alloy systems, it is clear that, by suitably combining the elements listed in the claims appended hereto, a similar effect can also be obtained for ternary systems. This effect is due to the nature of ternary alloy systems with respect to melting point and surface tension being obtained by merging the respective natures of binary alloy systems and pure metals. Similarly, it is obvious that an effect which is identical to that of binary systems can also be obtained for alloys of four or more elements.

Finally, an embodiment of the magnetic recording apparatus is described with reference to FIG. 8. The magnetic recording apparatus 1 has a housing 12 and a card 13 which is attached to the lower part of the housing 12 and on which electronic control circuits are mounted. The housing 12 comprises a base plate 14 and cover 15. The housing encloses a spindle motor 16 supported by a base plate 14, two magnetic disks 17 rotated by the spindle motor 16, four sliders 18 to which transducer heads (not shown) for reading or writing data from or to tile recording surface of the magnetic disks 17 are attached and which face four recording surfaces of the magnetic disks 17, four suspensions 20 to each of which a slider 18 is attached at one end, and an actuator 19 to which the other ends of the suspensions 20 are attached and which is supported rotatably on base plate 14 in order to position the transducer heads over one of the desired tracks on magnetic disks 17. Magnetic disks 17 have an uneven underlayer formed by depositing alloy grains on a substrate. The melting point of the alloy grains is in the range of approximately 100 degrees centigrade to approximately 350 degrees centigrade.

The base plate 14 and cover 15 can be sealed to each other to establish a controlled environment free from dust. The inside and outside of the housing 12 are connected to each other through a breather filter (not shown), so that a difference in atmospheric pressure is not created between the inside and outside of the housing 12. Electronic circuits for controlling reading or writing data from or to magnetic disks 17 through the transducer heads, electronic circuits for controlling the movement of the actuator, and electronic circuits for controlling the spindle motor that rotates magnetic disks 17 are mounted on a card 13 in a manner which takes into account heat production, connection to external devices, space, and so on.

As is shown by the result of the CSS test described above, in the magnetic recording apparatus shown in FIG. 7, the occurrence of adhesion is suppressed between the magnetic disks 17 and the transducer heads (not shown).

In accordance with the present invention, magnetic recording mediums suitable for practical use can be provided at a low cost. In addition, the occurrence of adhesion between a magnetic recording medium and a transducer head in magnetic recording apparatuses can be suppressed.

While there has been described magnetic recording media and methods for fabricating the media, it win be apparent to those skilled in the art that variations and modifications are possible without deviating from the spirit and broad scope of the present invention which shall be limited solely by the claims appended hereto.

We claim:

1. A magnetic recording medium with an intermediate layer of irregular thickness between a substrate and a magnetic layer to increase the irregularity in the topology of the surface of the magnetic medium, wherein the intermediate layer is selected from the group consisting of:

a) an alloy whose composition is expressed by $Zn_{100-x}M_x$ in atomic percentage, where M is at least one element selected from the group consisting of In, Sn, Bi, and Li, and x is in the range of approximately 80 to 90;

b) an alloy whose composition is expressed by $Mg_{100-y}L_y$ in atomic percentage, where L is at least one element selected from the group consisting of Pb, In, and Sn, and y is in the range of approximately 80 to 94;

c) an alloy whose composition by $Al_aGa_{100-a}$ or $Al_bSn_{100-b}$ in atomic percentage, where a is in the range of approximately 10 to 35 and b is in the range of approximately 1 to 5;

d) an alloy whose composition is expressed by $Bi_{100-c}N_c$ in atomic percentage, where N is selected from the group consisting of Pb, In, and Sn, and c is in the range of approximately 30 to 86; and e) an alloy whose composition is expressed by $T_{100-d}A_d$ in atomic percentage, where T is selected from the group consisting of In and Sn, A is selected from the group consisting of Pb and Sn, T and A are different elements, and d is in the range of approximately 20 to 55.

2. In a magnetic recording medium product which has a metal deposited on a substrate in spherically shaded structures between the substrate and a later deposited magnetic layer to roughen the surface of the storage medium product for the purpose of reducing adhesion to that surface by sensors used to read information stored in the recording medium, the improvement comprising a distinct intermediate layer of the spherically shaped structures in the finished magnetic recording medium product that is formed of a metal alloy which resists reaction with the magnetic layer and has a melting point in the range of approximately 100° centigrade and approximately 350° centigrade wherein said metal alloy is selected from the group consisting of:

a) an alloy whose composition is expressed by $Zn_{100-x}M_x$ in atomic percentage, where M is at least one element selected from the group consisting of In, Sn, Bi, and Li, and x is in the range of approximately 80 to 98;

b) an alloy whose composition is expressed by $Mg_{100-y}L_y$ in atomic percentage, where L is at least one element selected from the group consisting of Pb, In, and Sn, and y is in the range of approximately 80 to 94;

c) an alloy whose composition by $Al_aGa_{100-a}$ or $Al_bSn_{100-b}$ in atomic percentage, where a is in the range of approximately 10 to 35 and b is in the range of approximately 1 to 5;

d) an alloy whose composition is expressed by $Bi_{100-c}N_c$ in atomic percentage, where N is selected from the group consisting of Pb, In, and Sn, and c is in the range of approximately 30 to 85; and e) an alloy whose composition is expressed by $T_{100-d}A_d$ in atomic percentage, where T is selected from the group consisting of In and Sn, A is selected from the group consisting of Pb and Sn, T and A are different elements, and d is in the range of approximately to 20 to 55;

whereby improved magnetic properties are obtained for the magnetic recording medium product.

* * * * *